United States Patent [19]

Koura

[11] Patent Number: 4,975,417

[45] Date of Patent: Dec. 4, 1990

[54] PROCESS FOR PREPARING SUPERCONDUCTOR

[75] Inventor: Nobuyuki Koura, Kashiwa, Japan

[73] Assignee: Nisshin Steel Company, Limited, Tokyo, Japan

[21] Appl. No.: 329,896

[22] PCT Filed: Jun. 29, 1988

[86] PCT No.: PCT/JP88/00648

§ 371 Date: Mar. 15, 1989

§ 102(e) Date: Mar. 15, 1989

[87] PCT Pub. No.: WO89/00617

PCT Pub. Date: Jan. 26, 1989

[30] Foreign Application Priority Data

Jul. 17, 1987 [JP] Japan .................... 62-177016
Jan. 18, 1988 [JP] Japan .................... 63-6860

[51] Int. Cl.$^5$ ............... C25D 13/02; H01L 39/00
[52] U.S. Cl. .................. 505/1; 204/180.9; 204/181.1; 204/181.5; 204/38.6; 505/739; 505/740; 505/741
[58] Field of Search ............ 204/181.5, 180.9, 181.1, 204/38.6; 505/739, 740, 741, 1

[56] References Cited

U.S. PATENT DOCUMENTS

| | | | |
|---|---|---|---|
| 2,972,570 | 2/1961 | Haas | 204/38.6 |
| 3,575,838 | 4/1971 | Hughes | 204/181.5 |
| 3,841,986 | 10/1974 | Rion | 204/181.5 |
| 4,085,021 | 4/1978 | Van der Vliet | 204/181.5 |

FOREIGN PATENT DOCUMENTS 42-15288 8/1967 Japan .
50-20431 7/1975 Japan .
53-12916 2/1978 Japan .
59-200798 11/1984 Japan .

Primary Examiner—T. Tung
Assistant Examiner—Ben C. Hsing
Attorney, Agent, or Firm—Foley & Lardner, Schwartz, Jeffery, Schwaab, Mack, Blumenthal & Evans

[57] ABSTRACT

A superconductor is prepared by suspending in a solvent a ceramics superconductive material having been fired and ground into fine powder, and then electrodepositing the material on an electrode by an electrophoretic means, or again firing the material after electrodeposition, thus preparing superconductors with various shapes. The superconductors thus prepared may be covered with a metal to improve processability.

13 Claims, 2 Drawing Sheets

2θ (DEGREE) (Cu Kα)

PROCESS FOR PREPARING SUPERCONDUCTOR

TECHNICAL FIELD

This invention relates to a process for preparing an oxide-based superconductor, that can readily prepare superconductors with a variety of shapes.

BACKGROUND ART

In recent years, development of oxide-based superconductors has been energetically made, but, because of a poor processability of the oxide-based superconductors, it has become important to study how practically useful wires, thin films or sheet materials are to be prepared. Conventional methods of preparing superconductors include a sputtering process in which superconductor starting materials are fired and ground into powder, followed by press molding, and the resulting material is sputtered on a substrate; a screen printing process in which superconductor starting materials are fired, ground into powder, and thereafter kneaded into a paste, which is screen printed on a substrate; and a solvent coating process in which superconductor starting materials are fired, ground into powder, and thereafter dispersed in a solvent, which is coated on a substrate.

However, although the sputtering process can prepare superconductors with a uniform thickness regardless of the shape of the substrate, they are greatly affected by the properties of the substrate, at the same time resulting in compositional differences between sputtering materials and products, and also resulting in a poor continuous workability. On the other hand, the screen printing process or solvent coating process has no such problems, but can not yield superconductors with a uniform thickness if the substrate has irregularities, and also preliminary drying must be carried out to substantially completely remove the solvent in carrying out re-firing.

DISCLOSURE OF THE INVENTION

In the present invention, the superconductor is prepared by a process, comprising grinding a fired ceramics superconductive material into fine powder, suspending the powder in a solvent, and thereafter depositing the material on an electrode by an electrophoretic means, or again firing the material after deposition on the electrode, or covering with a metal the superconductor prepared by these procedures.

This invention is a process of preparing an oxide-based superconductor by an electrophoretic means, so that, even if a substrate has irregularities, grooves, holes or the like, the material can be deposited with a uniform thickness on those areas, there may be no dimensional limitations, and the thickness of superconductors can also be freely controlled. Also, the electrophoresis can be continuously operated if it is carried out according to methods such as wire plating, coil plating and barrel plating. Moreover, since the electrophoresis brings about electrodeposition of the suspended superconductive particles as they are, the superconductive material and a product can be made compositionally identical. Since also the particles in the solvent are deposited on a substrate by application of a voltage, there is given the same state as plating, and hence the particles can be closely adhered to the substrate, and the particles are also closely adhered between them. Therefore the superconductor prepared by utilizing electrophoresis is brought into almost the same state with a product obtained by press molding or more advantageously the same state with a product obtained by sintering.

BRIEF DESCRIPTION OF THE DRAWING

FIGS. 2 to 4 show characteristics of the superconductors prepared in Examples, in which FIG. 2 shows an X-ray diffraction pattern, FIG. 3, a graph to show a magnetic susceptibility, and FIG. 4, a graph of electrical resistivity, respectively.

BEST MODE FOR WORKING THE INVENTION

In preparing the superconductor in the present invention, similar to conventional methods, superconductor starting materials are first mixed in a given ratio, and the mixture is reacted by firing to make it into a superconductive material, and this superconductive material is ground into fine powder by means of a ball mill or the like. This powder may preferably be made to have a particle diameter of from 0.1 to 50 $\mu$m so that it can be uniformly suspended in a solvent.

Next, the resulting fine powder is suspended in a solvent, and deposited on an electrode, which serves as a substrate, by an electrophoretic means. Usually used as the solvent used in suspending the fine powder are nonconductive organic solvents, as exemplified by solvents of alcohol type, ketone type, ester type or lower carboxylic acid type, but preferred are solvents of alcohol type or ketone type.

A dispersion stabilizer may also be used in order to keep the fine powder uniformly dispersed in the solvent. Usable as this dispersion stabilizer are nitrocellulose, carboxynitrocellulose, ethylene glycol, polyvinyl alcohol, and pyrrolidone. The fine powder can be uniformly dispersed if the dispersion is carried out under ultrasonic irradiation.

To deposit the fine powder on the electrode by electrophoresis, a charging agent is added. As this charging agent, there may be used iodine, iodine with water, inorganic acids (as exemplified by sulfuric acid), lower carboxylic acids (as exemplified by acetic acid), halogen acids (as exemplified by hydrofluoric acid), hydroxides (as exemplified by ammonium hydroxide), nitrates or halides of alkali metals, Al, Y or La, and ions of rare earth elements or Fe.

The electrode may have any shape so long as it is conductive. Zirconia, silica or the like has been hitherto commonly used as the substrate on which the superconductor is formed, but such a substrate is not conductive. In instances in which such materials or alumina, magnesia, quartz glass, etc. are used in the electrode, electrical conductivity may be imparted thereto by covering it with a metal by electroless plating. Also, if the reactivity between the electrode and superconductor or the thermal expansion coefficient is questioned in the step of firing after the electrophoresis, the electrode may be beforehand covered with a material (as exemplified by silver) that may not cause such a problem. In addition, in the case of preparing superconductors that may have a good conductivity even if no firing is carried out after the electrophoresis, it is also possible to use readily workable materials, as exemplified by metals such as aluminum, conductive plastics, plastics to which electrical conductivity has been imparted, and composite materials thereof.

Figure 1:
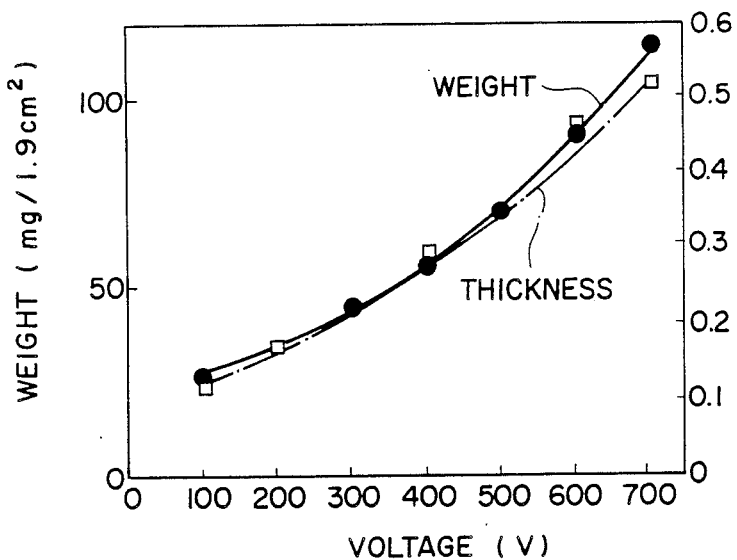
FIG. 1 is a graph showing the relationship between applied voltages and quantities of electrodeposition of superconductors when electrolysis was carried out for 1 minutes after ultrasonic stirring.

The electrophoresis may preferably be carried out by applying a voltage of not less than 100V so that uniform and dense electrodeposition may be achieved. The quantity of electrodeposition abruptly increases from 45 to 50 seconds after its initiation, but gently increases thereafter. If a bath is stirred in carrying out electrolysis, the quantity of electrodeposition can be remarkably increased as compared with the case when no stirring is carried out, and the quantity of electrodeposition becomes larger with increase in the applied voltage. For example, when the electrolysis is carried out for 1 minute with stirring, an increase in the applied voltage results in an increase in the quantity of electrodeposition as shown in FIG. 1.

Oxide superconductors include those which are stable to moisture, as exemplified by Bi-Sr-Ca-Cu-O types, and those which are unstable hereto, as exemplified by Y-Ba-Cu-O types. The former exhibits a reasonable superconductivity as a result of only depositing the superconductive material on the electrode by the electrophoresis. The latter, however, results in the formation of a trace amount of hydroxide when suspended in the solvent, where no good superconductivity is exhibited in some cases and therefore it is advisable to again carry out firing after the electrophoresis. In carrying out this firing, oxygen may be absorbed at the time of annealing, if oxygen is short in the superconductor.

EXAMPLE 1

$Y_2O_3$, $BaCO_3$ and CuO were mixed so as to be Y:Ba:Cu=1:2:3 in molar ratio, and the mixture was fired at 950for 12 hours in the air, and, after cooled, ground into fine powder using an agate mortar.

Next, 10 g of the resulting powder was thoroughly suspended under ultrasonic irradiation in 200 ml of acetone to which 40 mg of iodine was added.

Thereafter, using the resulting electrolytic solution, electrolysis was carried out at 200V for 10 minutes, setting an Ag wire serving as a working electrode and a Pt sheet serving as an opposite electrode. After the electrolysis, the working electrode was taken out, washed with acetone, dried, fired at 950° C. for 12 hours in the air, followed by annealing to 400° C. over a period of 10 hours, and thereafter cooled to room temperature.

Figure 2:
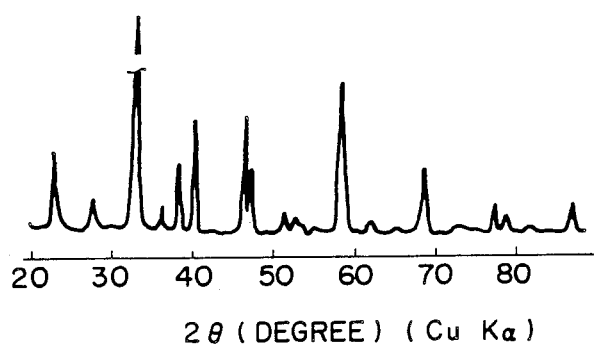

Next, electrodeposits were scraped from the Ag wire, and examined by X-ray diffractometry to obtain the diffraction pattern as shown in FIG. 2, showing that it was entirely coincident with the diffraction pattern of $Y_1Ba_2Cu_3O_{7-x}$ ($x=0.1$ to 0.2) which exhibits a complete superconductive characteristics.

Figure 3:
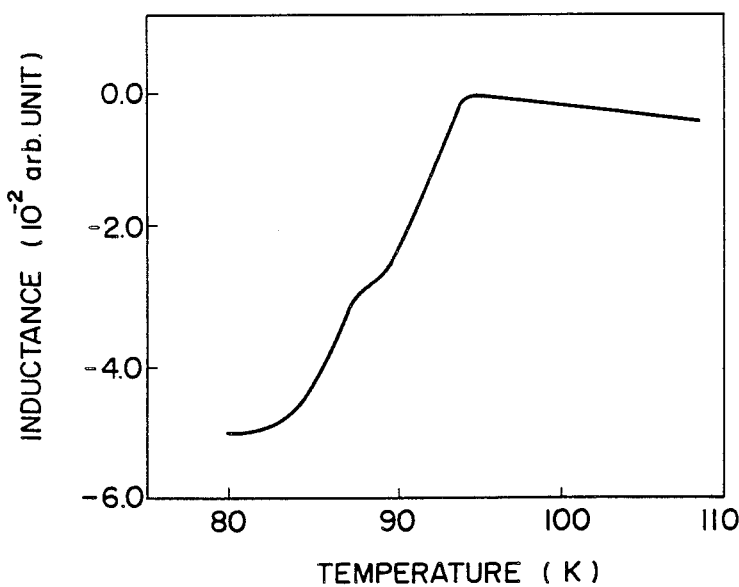

The magnetic susceptibility was also measured to reveal that an abrupt diamagnetism was exhibited at 93K or more as shown in FIG. 3, showing the Meissner effect.

Figure 4:
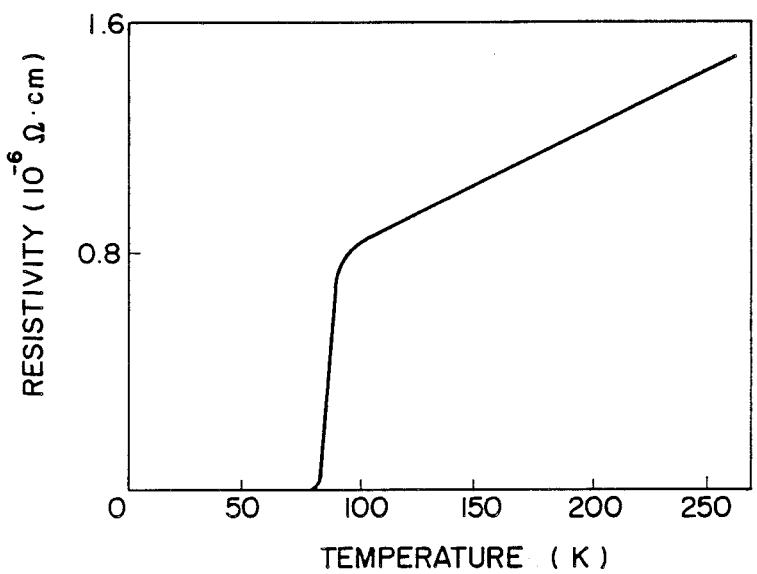

The electrical resistivity was further measured by flowing an electric current of 10 mA to reveal that as shown in FIG. 4 the resistivity became zero at about 90K.

EXAMPLE 2

Example 1 was repeated to prepare a superconductor, except that 2 ml of nitrocellulose and 20 ml of an alcohol solution of tetramethylammonium hydroxide were used in place of iodine added in the electrolytic solution in Example 1 and the electrophorectic electrolysis was carried out at 500V for 30 seconds. As a result, there was obtained the like superconductor as Example 1.

EXAMPLE 3

Example 1 was repeated to prepare a superconductor, except that the firing of superconductor starting materials was carried out with a cycle of 950° C. for 12 hours which was repeated twice, the iodine in the electrolytic solution was used in an amount of 100 mg, also the electrophoretic electrolysis was carried out at 500V for 10 minutes, and no firing was applied after the electrophoresis. As a result, the resulting superconductor had the same characteristics as Example 1.

EXAMPLE 4

The superconductor prepared in Example 3 was fired at 950° C. for 2 hours, to find that the strength was improved.

EXAMPLE 5

In Example 2, 180 ml of methyl isobutyl ketone and 30 ml of ethyl ether were used in place of the solvent acetone, the nitrocellulose was increased to 3 g, and the electrophoresis was carried out at 300V for 1 minute. Thereafter, the work electrode was taken out, washed with ethyl ether, followed by firing under conditions same as Example 1. The resulting superconductor had the same characteristics as Example 1.

EXAMPLE 6

In Example 2, 120 ml of isopropyl alcohol and 80 ml of acetone were used in place of the solvent acetone in the electrolytic solution, and also 1 g of ethyl acetate was used in place of nitrocellulose, 2 $\mu l$ of HF in place of conc. sulfuric acid, and a Ti sheet in place of the opposite electrode Pt sheet, respectively, to carry out the electrophoresis with electrolysis at 300V for 1 minute, and then, after washing with ethyl ether, the firing was carried out under conditions same as Example 1. The resulting superconductor also had the same characteristics as Example 1.

EXAMPLE 7

To the superconductors prepared in Examples 1 to 6, electroplating of aluminum was applied using an aluminum chloride and N-butyl pyridinium mOlten salt bath. As a result, it was possible to prepare superconductors showing strength to bending.

EXAMPLE 8

In Example 1, the electrophoresis was carried out at an applied voltage of 50V, to find that the electrodeposits were formed with a poor adhesion, and also with scattering of electrodeposition.

POSSIBILITY FOR INDUSTRIAL UTILIZATION

As described above, this invention is a process of preparing a superconductor by an electrophoretic means, and hence it is rich in mass-productivity, and further can be utilized in preparing superconductors for the use for which they have been prepared with difficulty because of the size, shape, substrate characteristics, etc.

I claim:

1. A process for preparing a superconductor, comprising the steps of:
   grinding a fired ceramics superconductive material into fine powder;
   suspending said powder in a solvent;

adding a charging agent selected from the group consisting of iodine and iodine water; and electrophoretically depositing the superconductive material on an electrode.

2. The process for preparing a superconductor as described in claim 1, wherein a dispersion stabilizer is added in the solvent.

3. The process for preparing a superconductor as described in claim 1, wherein the ceramics superconductive material is ground into fine powder with a particle diameter of from 0.1 to 50 $\mu$m.

4. The process for preparing a superconductor as described in claim 1, wherein a solvent of ketone type is used as the solvent.

5. The process for preparing a superconductor as described in claim 1, wherein a solvent of alcohol type is used as the solvent.

6. The process for preparing a superconductor as claimed in claim 1, wherein the superconductive material is selected from the group consisting of Bi-Sr-Ca-Cu-O and Y-Ba-Cu-O superconductive ceramic oxides.

7. A process for preparing a superconductor, comprising the steps of:

grinding a fired ceramics superconductive material into fine powder;

suspending said powder in a solvent;

adding a charging agent selected from the group consisting of iodine and iodine water;

electrophoretically depositing the superconductive material on an electrode; and thereafter covering the resulting superconductor with a metal.

8. The process for preparing a superconductor as described in claim 7, wherein the covering with a metal is carried out by electroplating.

9. A process for preparing a superconductor, comprising the steps of:

grinding a fired ceramics superconductive material into fine powder;

suspending said powder in a solvent;

adding a charging agent selected from the group consisting of iodine and iodine water;

electrophoretically depositing the superconductive material on an electrode; and then firing the resulting superconductor.

10. The process for preparing a superconductor as claimed in claim 9, wherein the superconductive material is a Y-Ba-Cu-O superconductive ceramic oxides.

11. A process for preparing a superconductor, comprising the steps of:

grinding a fired ceramics superconductive material into fine powder;

suspending said powder in a solvent;

adding a charging agent selected from the group consisting of iodine and iodine water;

electrophoretically depositing the superconductive material on an electrode;

firing the resulting superconductor; and thereafter covering the resulting superconductor with a metal.

12. The process for preparing a superconductor as described in claim 11, wherein the covering with a metal is carried out by electroplating.

13. The process for preparing a superconductor as claimed in claim 11, wherein the superconductive material is a Y-Ba-Cu-O superconductive ceramic oxides.

* * * * *